(12) United States Patent
Syu et al.

(10) Patent No.: US 8,924,627 B2
(45) Date of Patent: Dec. 30, 2014

(54) FLASH MEMORY DEVICE COMPRISING HOST INTERFACE FOR PROCESSING A MULTI-COMMAND DESCRIPTOR BLOCK IN ORDER TO EXPLOIT CONCURRENCY

(75) Inventors: Mei-Man L. Syu, Fremont, CA (US); Robert L. Horn, Yorba Linda, CA (US); Virgil V. Wilkins, Perris, CA (US); Dominic S. Suryabudi, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 947 days.

(21) Appl. No.: 13/073,638

(22) Filed: Mar. 28, 2011

(65) Prior Publication Data

US 2012/0254504 A1    Oct. 4, 2012

(51) Int. Cl.
| G06F 12/00 | (2006.01) |
| G06F 13/00 | (2006.01) |
| G06F 13/28 | (2006.01) |
| G11C 7/10 | (2006.01) |

(52) U.S. Cl.
CPC .................................. *G11C 7/10* (2013.01)
USPC .......................................... 711/103; 711/115

(58) Field of Classification Search
None
See application file for complete search history.

(56) References Cited

U.S. PATENT DOCUMENTS

| 4,371,929 | A | * | 2/1983 | Brann et al. ..................... 710/45 |
| 5,954,801 | A | * | 9/1999 | Sokolov ............................ 710/5 |
| 7,747,874 | B2 | * | 6/2010 | Goodwill et al. ............. 713/193 |
| 8,429,328 | B2 | * | 4/2013 | Tanik ............................ 711/103 |
| 2006/0095659 | A1 | | 5/2006 | New et al. |
| 2008/0049520 | A1 | * | 2/2008 | Kang et al. ................ 365/185.33 |
| 2009/0113121 | A1 | | 4/2009 | Lee et al. |
| 2009/0164698 | A1 | | 6/2009 | Ji et al. |
| 2009/0164704 | A1 | | 6/2009 | Kanade et al. |
| 2009/0292865 | A1 | | 11/2009 | Hong |
| 2010/0023800 | A1 | | 1/2010 | Harari et al. |
| 2010/0122021 | A1 | | 5/2010 | Lee et al. |
| 2010/0146163 | A1 | | 6/2010 | Son et al. |
| 2010/0161936 | A1 | | 6/2010 | Royer et al. |
| 2010/0217927 | A1 | | 8/2010 | Song et al. |
| 2010/0223440 | A1 | * | 9/2010 | Goodwill et al. ............. 711/163 |
| 2010/0262721 | A1 | | 10/2010 | Asnaashari et al. |
| 2010/0262738 | A1 | * | 10/2010 | Swing et al. .................. 710/260 |
| 2011/0004723 | A1 | | 1/2011 | Kheng-Chong |
| 2011/0055457 | A1 | | 3/2011 | Yeh |

OTHER PUBLICATIONS busTRACE 9.0 User's Manual, 2000-2011, busTRACE™ Technologies LLC., http://www.bustrace.com, pp. 1-4.*
Jedec, "Non-Sequential Read Enhancement—Data Tag Extension", Nov. 2010, Revision A.

* cited by examiner

*Primary Examiner* — Yaima Rigol

(57) ABSTRACT

A flash memory device is disclosed comprising a flash controller for accessing a first flash memory over a first channel and a second flash memory over a second channel. A multi-command descriptor block is received from a host, wherein the multi-command descriptor block comprises identifiers for identifying a plurality of access commands that the host is preparing to request. A first group of the access commands are selected to execute concurrently and a second group of the access commands are selected to execute concurrently. The first group of access commands are received from the host and executed concurrently by accessing at least the first and second flash memories concurrently. The second group of access commands are received from the host and executed concurrently by accessing at least the first and second flash memories concurrently.

24 Claims, 4 Drawing Sheets

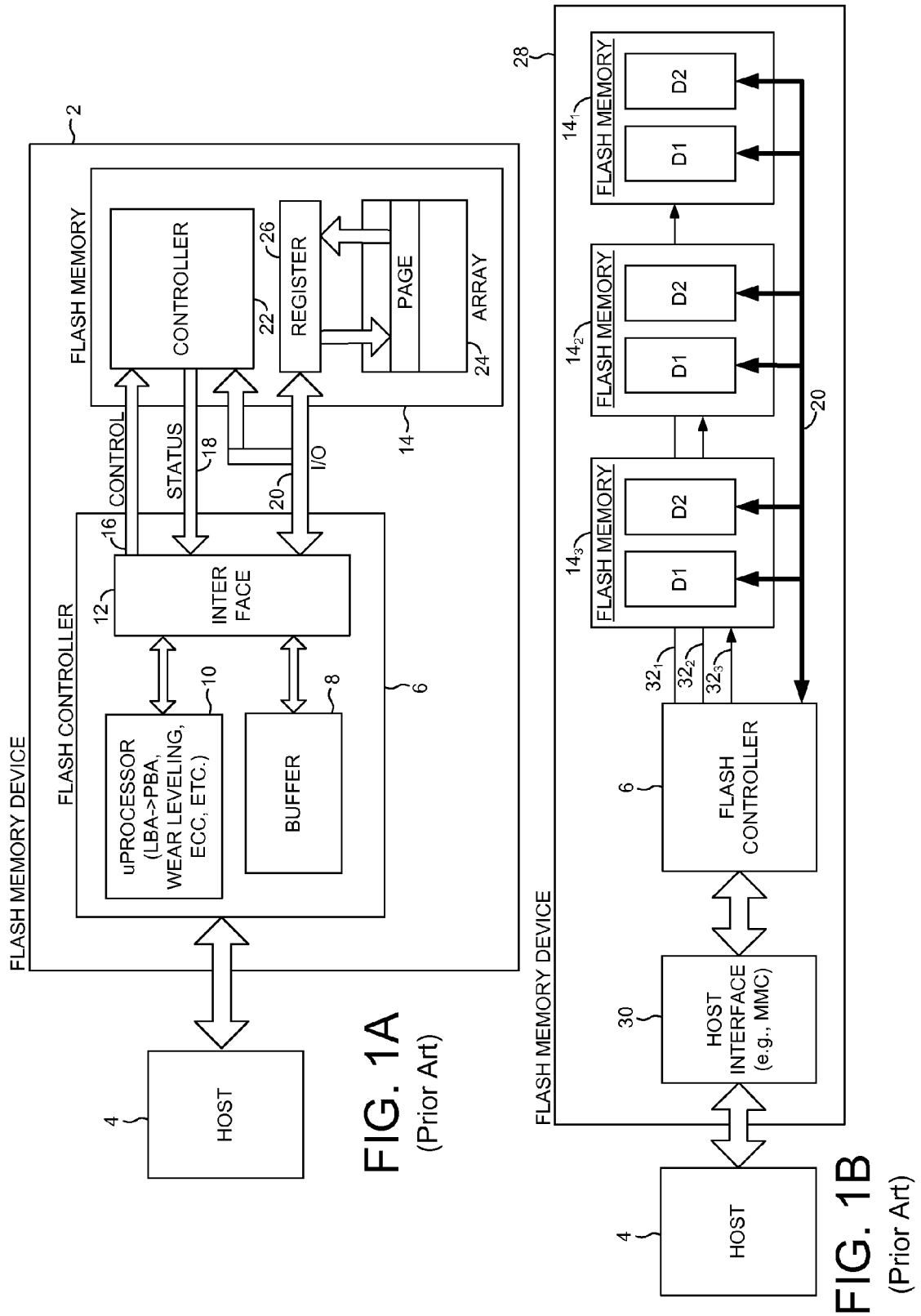

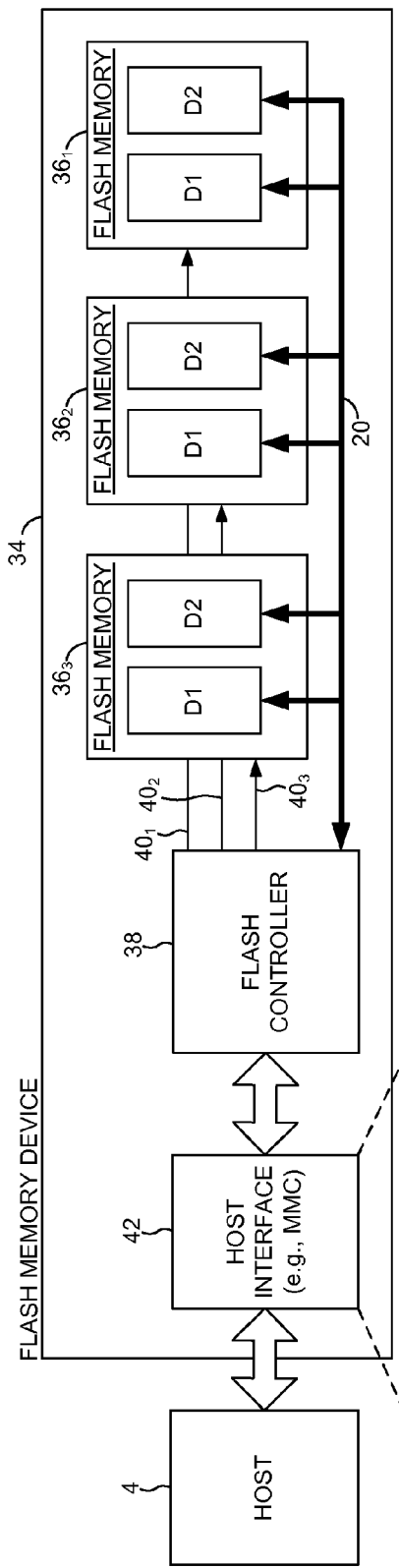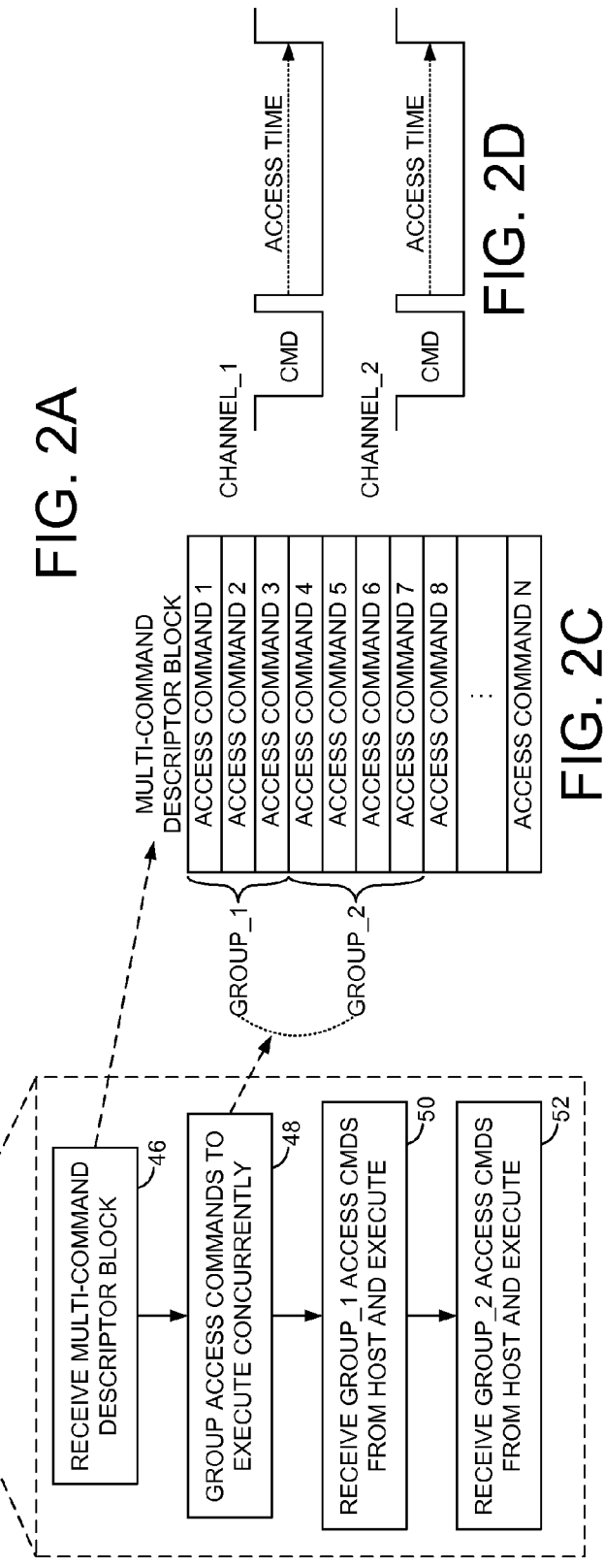

FLASH MEMORY DEVICE COMPRISING HOST INTERFACE FOR PROCESSING A MULTI-COMMAND DESCRIPTOR BLOCK IN ORDER TO EXPLOIT CONCURRENCY

BACKGROUND

A flash memory device may be employed as mass storage for a computer system (e.g., desktop, laptop, portable, etc.) or a consumer device (e.g., music player, cell phone, camera, etc.) or other suitable application. The flash memory device may comprise one or more flash memories (e.g., NAND, NOR, etc.) and a flash controller for accessing each flash memory. Each flash memory is coupled to an I/O bus, as well as a number of interface control lines. When issuing a program command or an erase command to a memory device, the flash controller transfers the address and command data (and write data for a program operation) over the I/O bus. When issuing a read command, the flash controller transfers the address and command data over the I/O bus and then receives the read data over the I/O bus.

FIG. 1A shows a prior art flash memory device 2 communicating with a host 4 according to a suitable communication protocol. A flash controller 6 comprises a buffer 8 for buffering data for write/read commands, and a microprocessor 10 executing control programs for various algorithms, such as a logical block address (LBA) to physical block address (PBA) mapping, wear leveling, error correction code, etc. The flash controller 6 further comprises interface circuitry 12 for interfacing with one or more flash memories 14. The interface circuitry 12 generates suitable control signals 16 and receives status information 18 from the flash memory 14 in connection with executing write/read commands initiated by the microprocessor 10. The interface circuitry 12 also transmits and receives data over an I/O bus 20, including read/write data stored in the buffer 8 or command data generated by the microprocessor 10 and transmitted to a controller 22 integrated with the flash memory 14.

The flash memory 14 comprises an array of memory cells 24 that may be accessed in memory segments referred to as pages. During a write operation, write data received over the I/O bus 20 from the buffer 8 is first stored in a data register 26. The controller 22 then transfers the write data from the data register 26 to a target page in the memory array 24. During a read operation, a page in the memory array 24 is read into the data register 26 and then transferred over the I/O bus 20 where it is stored in the buffer 8.

There is an access time involved with programming the write data stored in the data register 26 to a target page in the memory array 24 during a write operation, as well as with reading data from a target page in the memory array 24 into the data register 26 during a read operation. A busy status is typically returned to the flash controller 6 until the flash memory 14 is finished accessing the memory array 24. As described in greater detail below, the flash memory device 2 may comprise multiple flash memories that may be programmed concurrently (e.g., concurrent write or read operations) thereby overlapping the access times of the flash memories and increasing the throughput of the flash memory device.

FIG. 1B shows a prior art flash memory device 28 comprising a host interface 30 for implementing a standard communication protocol (e.g., Multi Media Card (MMC), Universal Serial Bus (USB), Universal Flash Storage (UFS), etc.) for communicating with the host 4. The flash memory device 28 also comprises a number of flash memories $14_1$-$14_3$, wherein each flash memory $14_i$ comprises two devices D1 and D2, and each device comprises a memory array 24 and corresponding data register 26. The flash controller 6 comprises separate channels $32_1$-$32_3$ (each comprising control 16, status 18, and I/O bus 20 shown in FIG. 1A) for communicating with the respective flash memories $14_1$-$14_3$. This configuration increases throughput by enabling the flash controller 6 to execute concurrent operations using the multiple devices as well as the multiple channels. For example, the flash controller 6 may execute a write operation by writing data to the data registers in the devices D1 and D2 of the first flash memory $14_1$, and then command the first flash memory $14_1$ to program the data register into a target page of each device. During the access time of the first flash memory $14_1$, the flash controller 6 may write more data to the data register in the devices D1 and D2 of the second flash memory $14_2$, and then command the second flash memory $14_2$ to program the data register into a target page of each device. Yet more data may be processed by writing data to the third memory device $14_3$ such that the access times of all three flash memories overlap as they concurrently process their respective data. A similar performance enhancement may also be achieved for read operations by commanding multiple flash memories to concurrently read data from their respective devices.

BRIEF DESCRIPTION OF THE DRAWINGS

FIG. 1A shows a prior art flash memory device comprising a flash controller for accessing a flash memory.

FIG. 1B shows a prior art flash memory device comprising a host interface for implementing a conventional communication protocol (e.g., Multi Media Card (MMC), Universal Serial Bus (USB), Universal Flash Storage (UFS), etc.).

FIG. 2A shows a flash memory device according to an embodiment of the present invention comprising a host interface operable to receive a multi-command descriptor block comprising identifiers for identifying a plurality of access commands that a host is preparing to request.

FIG. 2B is a flow diagram according to an embodiment of the present invention wherein the access commands are grouped and then executed concurrently by concurrently accessing at least first and second flash memories.

FIG. 2C shows an example multi-command descriptor block according to an embodiment of the present invention.

FIG. 2D illustrates an embodiment for concurrently accessing the first and second flash memories wherein at least part of the access times overlap.

DETAILED DESCRIPTION OF EMBODIMENTS OF THE INVENTION

Figure 3:
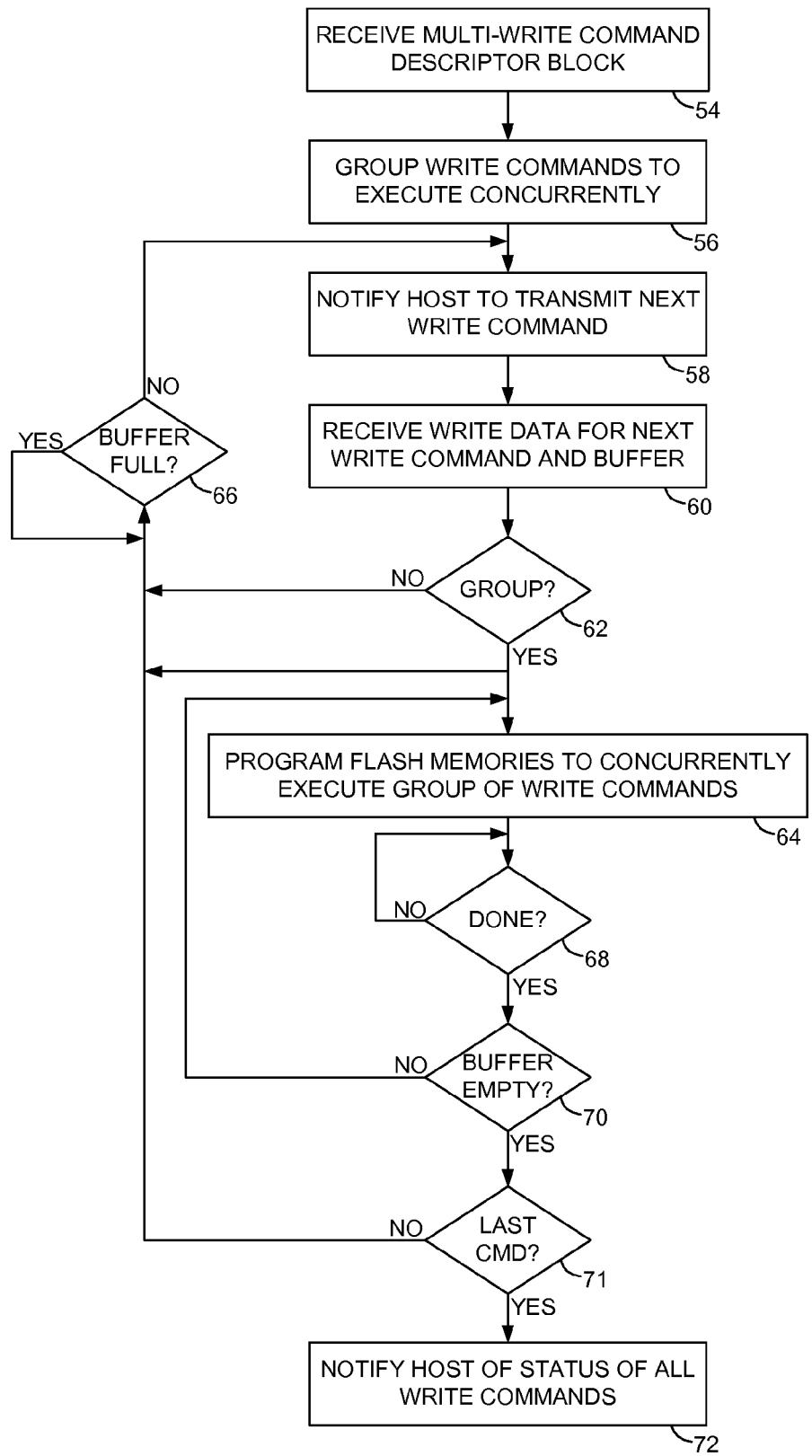
FIG. 3 is a flow diagram according to an embodiment of the present invention wherein the multi-command descriptor block identifies a plurality of write commands.

FIG. 2A shows a flash memory device 34 comprising a plurality of flash memories $36_1$-$36_3$, including a first flash memory $36_1$ and a second flash memory $36_2$. A flash controller 38 accesses the first flash memory $36_1$ over a first channel $40_1$ and the second flash memory $36_2$ over a second channel $40_2$. A host interface 42 performs the operations shown in the flow diagram of FIG. 2B, wherein a multi-command descriptor block is received from a host 4 (step 46). The multi-command descriptor block comprises identifiers for identifying a plurality of access commands that the host is preparing to request (FIG. 2C). A first group of the access commands are selected to execute concurrently and a second group of the access commands are selected to execute concurrently (step 48). The first group of access commands are received from the host and executed concurrently by accessing at least the first and second flash memories concurrently (step 50). The second group of access commands are received from the host and executed concurrently by accessing at least the first and second flash memories concurrently (step 52).

Any suitable flash memory 36 may be employed in the embodiments of the present invention, such as any suitable non-volatile electrically erasable and programmable semiconductor memory. Typical flash memories found on the market include NAND type memories and NOR type memories; however, the aspects of the present invention are applicable to any type of memory available now as well as in the future.

The multi-command descriptor block is shown generally in FIG. 2C, but in practice it may comprise any suitable format including additional fields to support any suitable communication protocol. In one embodiment, the multi-command descriptor block may be implemented as a new command of a communication protocol or incorporated into an existing command of a communication protocol (i.e., become a payload of an existing command). In one embodiment, the access command may comprise a write command, a read command, or an erase command. An erase command might be issued by a user of the flash memory device to physically erase data stored in one or more of the flash memories. In one embodiment, the multi-command descriptor block may comprise a mixture of the different commands, including write and read commands. However, in an embodiment that allows both write and read commands in the same descriptor block, the access commands must be executed in the proper order to ensure data coherency (i.e., ensure write commands are executed before read commands when accessing the same address). In another embodiment, the multi-command descriptor block may comprise write and erase commands, or read and erase commands, but not both write and read commands in order to simplify the implementation by avoiding the data coherency issue.

In one embodiment, the channels $40_1$-$40_3$ for communicating with the flash memories $36_1$-$36_3$ may be implemented separately with the capability of being programmed concurrently by the flash controller 38. This embodiment is illustrated in FIG. 2D wherein the flash controller 38 may issue an access command to two or more channels concurrently such that the command times overlap. In an alternative embodiment, the channels $40_1$-$40_3$ may be multiplexed such that the flash controller 38 issues access commands serially to each of the target flash memories. In this embodiment, the command times would not overlap as illustrated in FIG. 2D. However, in both embodiments the access times of the flash memories (the time required to write data to the memory array or read data from the memory array or erase the memory array) would overlap at least partially and therefore the flash memories are accessed concurrently at least part of the access time.

The multi-command descriptor block in the embodiment of FIG. 2C helps improve performance by delaying execution of the access commands received from the host. That is, the host interface 42 evaluates the access commands in the multi-command descriptor block to determine how to execute the commands in an order that takes advantage of concurrent access of the flash memories. For example, when the multi-command descriptor block identifies multiple read commands, the read commands can be grouped and then executed so that data can be read concurrently from two or more of the flash memories $36_1$-$36_3$. For write commands, the write data is buffered for several of the write commands until enough data is received to allow concurrent writing to two or more of the flash memories $36_1$-$36_3$. Erase commands may also be interleaved with read or write commands in order to erase data stored in a first of the flash memories and read or write data from/to a second of the flash memories.

FIG. 3 is a flow diagram according to an embodiment of the present invention wherein a multi-command descriptor block comprising a plurality of write commands is received from the host (step 54). The write commands are evaluated and grouped so as to increase throughput by executing the write commands in an order that enables concurrent writing to at least two of the flash memories (step 56). After grouping the write commands, the host is notified to send the next command (the first write command (step 58)) which may be implemented as an acknowledgement transmitted to the host that the flash memory device is finished processing the multi-command descriptor block. The write data for the write command is received and buffered in memory (step 60). The process is then repeated by notifying the host to send the next write command (step 58) and the write data buffered in memory (step 60) until enough write data is buffered to enable concurrent writing (step 62). In the embodiment of FIG. 3, the write operation is delayed until enough write commands are received corresponding to a group identified in step 56. In other embodiments, the write operation may begin before all of the write commands of a group have been received.

Once enough write data has been buffered, at least two of the flash memories are programmed to write the data to the corresponding memory arrays (step 64) as illustrated in FIG. 2D. In the embodiment of FIG. 3, the write data for subsequent write commands are transferred from the host concurrent with accessing (writing) the memory arrays in the flash memories. That is, step 58 and step 60 are executed concurrently with step 64 (until the write buffer is full at step 66). If the write buffer is full at step 66, the process of receiving write data from the host is paused until buffered write data is written to the flash memories at step 64 (thereby freeing space in the write buffer). This embodiment increases performance (increases throughput) by overlapping the receiving of write data from the host with the concurrent writing of data to the flash memories. When a current write operation to the flash memories finishes (step 68), the process is repeated starting at step 64 until the write buffer is empty (step 70), and the process is repeated starting at step 58 until all of the write commands have been processed (step 71). After completing the write operation for the last write command, the flash memory device notifies the host of the status (step 72) of all of the write commands received in the multi-command descriptor block (as well as the status of any erase commands that may have been included in the multi-command descriptor block).

Figure 4:
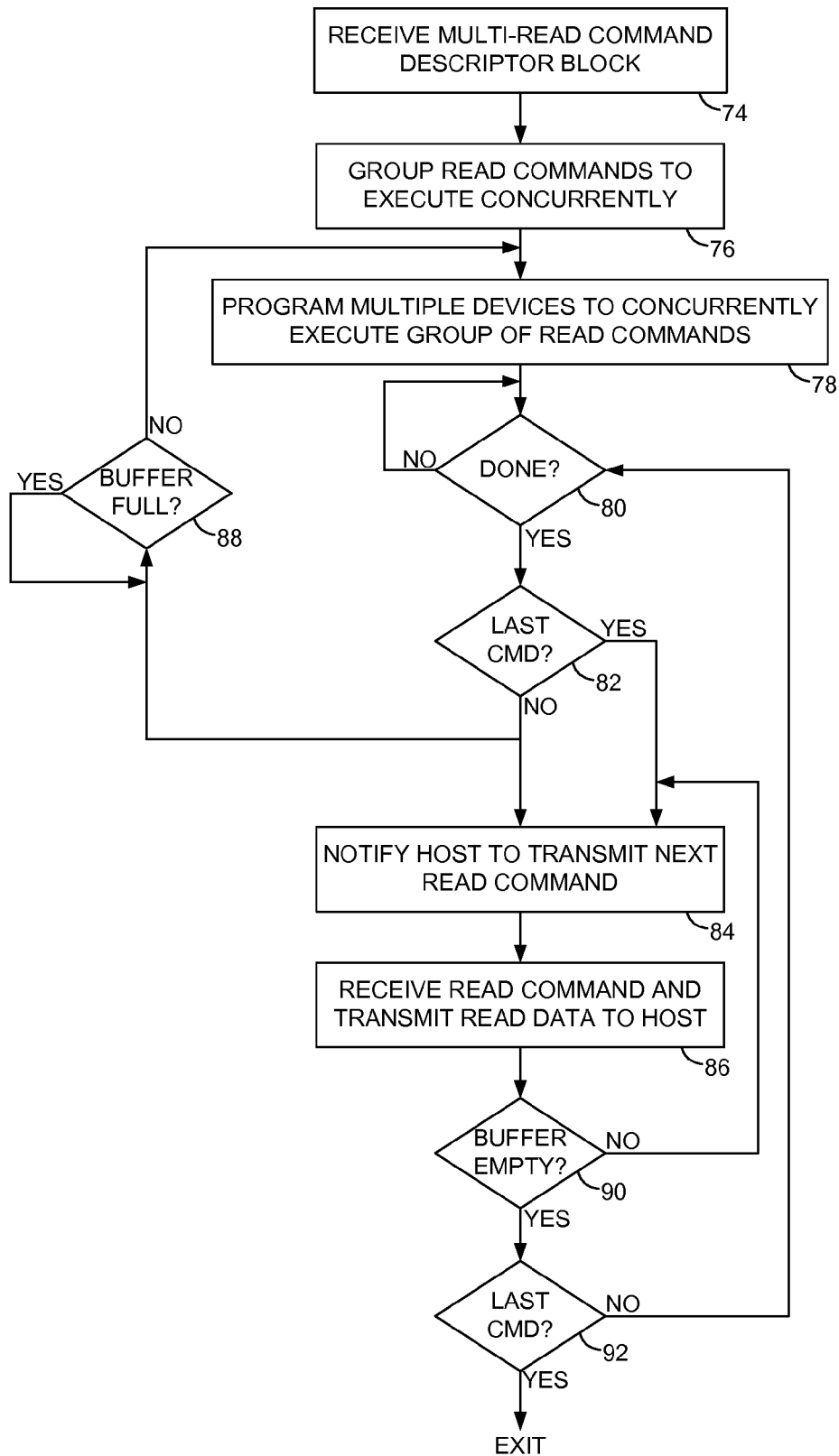
FIG. 4 is a flow diagram according to an embodiment of the present invention wherein the multi-command descriptor block identifies a plurality of read commands.

FIG. 4 is a flow diagram according to an embodiment of the present invention wherein a multi-command descriptor block comprising a plurality of read commands is received from the host (step 74). The read commands are evaluated and grouped so as to increase throughput by executing the read commands in an order that enables concurrent reading from at least two of the flash memories (step 76). At least two of the flash memories are then programmed to read data concurrently from their memory arrays (step 78) wherein the read data is buffered in a read buffer. When finished with the current read operation (step 80) the process is repeated starting at step 78 until all of the read commands have been executed (step 82). The process of reading data from the flash memories may be paused if the read buffer becomes full at step 88.

Once enough read data has been buffered in the read buffer, the host is notified to transmit the next access command (the first read command (step 84)) which may be implemented as an acknowledgement transmitted to the host that the flash memory device is finished processing the multi-command descriptor block. When the read command is received from the host, the corresponding read data is transmitted to the host from the read buffer (step 86). In the embodiment of FIG. 4, the step of transmitting the read data to the host is executed concurrently with reading data from the flash memories. That is, step 84 and step 86 are executed concurrently with step 78 (until the read buffer is full at step 88). If the read buffer is full at step 88, the process of reading data from the flash memories is paused until buffered read data is transferred to the host at step 86 (thereby freeing space in the read buffer). This embodiment increases performance (increases throughput) by overlapping the transmitting of read data to the host with the concurrent reading of data from the flash memories. Step 84 and step 86 are repeated until the read buffer is empty at step 90, wherein the flow diagram is repeated from step 80 until the last read command has been processed at step 92.

The control circuitry (e.g., host interface 42 and/or flash controller 38 of FIG. 2A) in the flash memory device may comprise any suitable circuitry for implementing the flow diagrams herein, such as one or more integrated circuits. In one embodiment, the control circuitry may comprise one or more microprocessors for executing code segments of a control program. In other embodiments, the control circuitry may comprise state machine circuitry in an application specific integrated circuit (ASIC).

What is claimed is:

1. A flash memory device comprising:
a plurality of flash memories, including a first flash memory and a second flash memory;
a flash controller for accessing the first flash memory over a first channel and the second flash memory over a second channel; and
a host interface operable to:
receive a multi-command descriptor block from a host, wherein the multi-command descriptor block comprises identifiers for identifying a plurality of access commands that the host is preparing to request;
select a first group of the access commands to execute concurrently and select a second group of the access commands to execute concurrently;
after receiving the multi-command descriptor block, receive the first group of access commands from the host;
execute the first group of access commands concurrently by accessing at least the first and second flash memories concurrently;
after receiving the multi-command descriptor block, receive the second group of access commands from the host; and
execute the second group of access commands concurrently by accessing at least the first and second flash memories concurrently.

2. The flash memory device as recited in claim 1, wherein:
the first group of access commands comprises a first group of write commands; and
the second group of access commands comprises a second group of write commands.

3. The flash memory device as recited in claim 2, wherein the host interface is further operable to:
receive the first group of write commands from the host including first write data; and
after receiving the first group of write commands and first write data, concurrently write the first write data to at least the first and second flash memories.

4. The flash memory device as recited in claim 3, wherein the host interface is further operable to receive the second group of write commands from the host including second write data concurrently with writing the first write data to at least the first and second flash memories.

5. The flash memory device as recited in claim 4, wherein after concurrently writing the first write data to at least the first and second flash memories, the host interface is further operable to concurrently write the second write data to at least the first and second flash memories.

6. The flash memory device as recited in claim 5, wherein after concurrently writing the second write data to at least the first and second flash memories, the host interface is further operable to notify the host of an execution status of the access commands identified by the multi-command descriptor block.

7. The flash memory device as recited in claim 1, wherein:
the first group of access commands comprises a first group of read commands; and
the second group of access commands comprises a second group of read commands.

8. The flash memory device as recited in claim 7, wherein the host interface is further operable to:
concurrently read first data from at least the first and second flash memories, wherein the first data corresponds to the first group of read commands;
receive the first group of read commands from the host; and
transfer the first data to the host.

9. The flash memory device as recited in claim 8, wherein the host interface is further operable to receive the first group of read commands from the host concurrently with reading the first data from at least the first and second flash memories.

10. The flash memory device as recited in claim 9, wherein:
after concurrently reading the first data from at least the first and second flash memories, the host interface is further operable to concurrently read second data from at least the first and second flash memories; and
the second data corresponds to the second group of read commands.

11. The flash memory device as recited in claim 1, wherein:
the first group of access commands comprises at least one write command; and
the second group of access commands comprises at least one erase command.

12. The flash memory device as recited in claim 1, wherein:
the first group of access commands comprises at least one read command; and
the second group of access commands comprises at least one erase command.

13. A method of operating a flash memory device comprising, the flash memory device comprising a plurality of flash memories, including a first flash memory and a second flash memory, and a flash controller for accessing the first flash memory over a first channel and the second flash memory over a second channel, the method comprising:
receiving a multi-command descriptor block from a host, wherein the multi-command descriptor block comprises identifiers for identifying a plurality of access commands that the host is preparing to request;
selecting a first group of the access commands to execute concurrently and selecting a second group of the access commands to execute concurrently;

after receiving the multi-command descriptor block, receiving the first group of access commands from the host;

executing the first group of access commands concurrently by accessing at least the first and second flash memories concurrently;

after receiving the multi-command descriptor block, receiving the second group of access commands from the host; and executing the second group of access commands concurrently by accessing at least the first and second flash memories concurrently.

14. The method as recited in claim 13, wherein:
the first group of access commands comprises a first group of write commands; and
the second group of access commands comprises a second group of write commands.

15. The method as recited in claim 14, further comprising:
receiving the first group of write commands from the host including first write data; and
after receiving the first group of write commands and first write data, concurrently writing the first write data to at least the first and second flash memories.

16. The method as recited in claim 15, further comprising receiving the second group of write commands from the host including second write data concurrently with writing the first write data to at least the first and second flash memories.

17. The method as recited in claim 16, wherein after concurrently writing the first write data to at least the first and second flash memories, further comprising concurrently writing the second write data to at least the first and second flash memories.

18. The method as recited in claim 17, wherein after concurrently writing the second write data to at least the first and second flash memories, further comprising notifying the host of an execution status of the access commands identified by the multi-command descriptor block.

19. The method as recited in claim 13, wherein:
the first group of access commands comprises a first group of read commands; and
the second group of access commands comprises a second group of read commands.

20. The method as recited in claim 19, further comprising:
concurrently reading first data from at least the first and second flash memories, wherein the first data corresponds to the first group of read commands;
receiving the first group of read commands from the host; and
transferring the first data to the host.

21. The method as recited in claim 20, further comprising receiving the first group of read commands from the host concurrently with reading the first data from at least the first and second flash memories.

22. The method as recited in claim 21, wherein:
after concurrently reading the first data from at least the first and second flash memories, further comprising concurrently reading second data from at least the first and second flash memories; and
the second data corresponds to the second group of read commands.

23. The method as recited in claim 13, wherein:
the first group of access commands comprises at least one write command; and
the second group of access commands comprises at least one erase command.

24. The method as recited in claim 13, wherein:
the first group of access commands comprises at least one read command; and
the second group of access commands comprises at least one erase command.

* * * * *